United States Patent [19]
Nakanishi

[11] Patent Number: 5,145,797
[45] Date of Patent: Sep. 8, 1992

[54] METHOD OF MAKING SEMICONDUCTOR DEVICES HAVING AN IMPLANT DAMAGE PROTECTION FILM ON THE GATE ELECTRODE SIDEWALLS

[75] Inventor: Shoji Nakanishi, Tokyo, Japan

[73] Assignee: Seiko Instruments, Inc., Tokyo, Japan

[21] Appl. No.: 648,516

[22] Filed: Jan. 30, 1991

[30] Foreign Application Priority Data

Jan. 30, 1990 [JP] Japan .................. 2-19651

[51] Int. Cl.$^5$ .......................... H01L 21/266
[52] U.S. Cl. ....................... 437/43; 437/44; 437/61
[58] Field of Search ............ 437/43, 983, 41, 44, 437/45, 61

[56] References Cited
U.S. PATENT DOCUMENTS
4,804,637 2/1989 Smayling et al. .......... 437/43
4,852,062 7/1989 Baker et al. ............... 437/43
4,868,137 9/1989 Kubota ...................... 437/43

FOREIGN PATENT DOCUMENTS
0121683 7/1983 Japan ...................... 437/43
0088369 4/1987 Japan ...................... 437/43

*Primary Examiner*—Brian E. Hearn
*Assistant Examiner*—C. Chaudhari
*Attorney, Agent, or Firm*—Spensley, Horn, Jubas & Lubitz

[57] ABSTRACT

In a MOS transistor or memory cell that uses a thin oxide film as a gate insulation film, ion-implantation-induced damage protection films (mask oxide films) are formed on side walls of a polysilicon gate electrode to minimize flaws in the structure of the thin oxide film right under the polysilicon gate electrode edge, which are induced by the ion implantation performed during the process of forming self-aligned source and drain regions.

2 Claims, 2 Drawing Sheets

FIG. 2
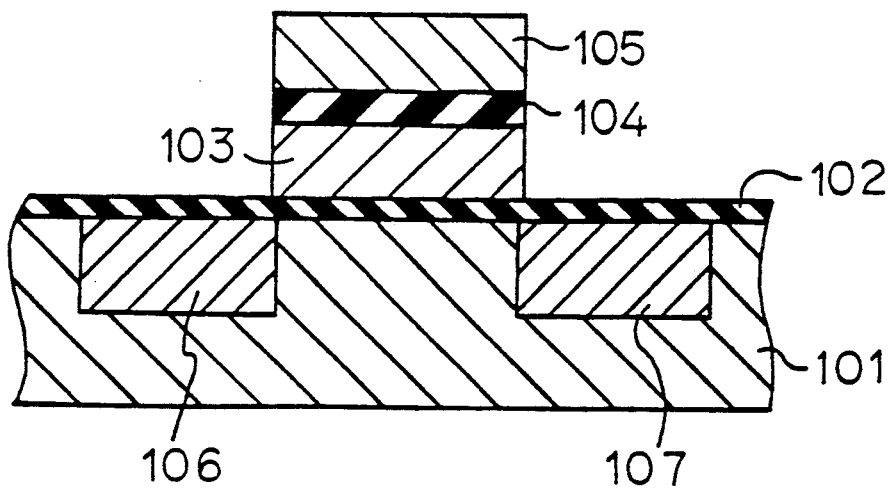
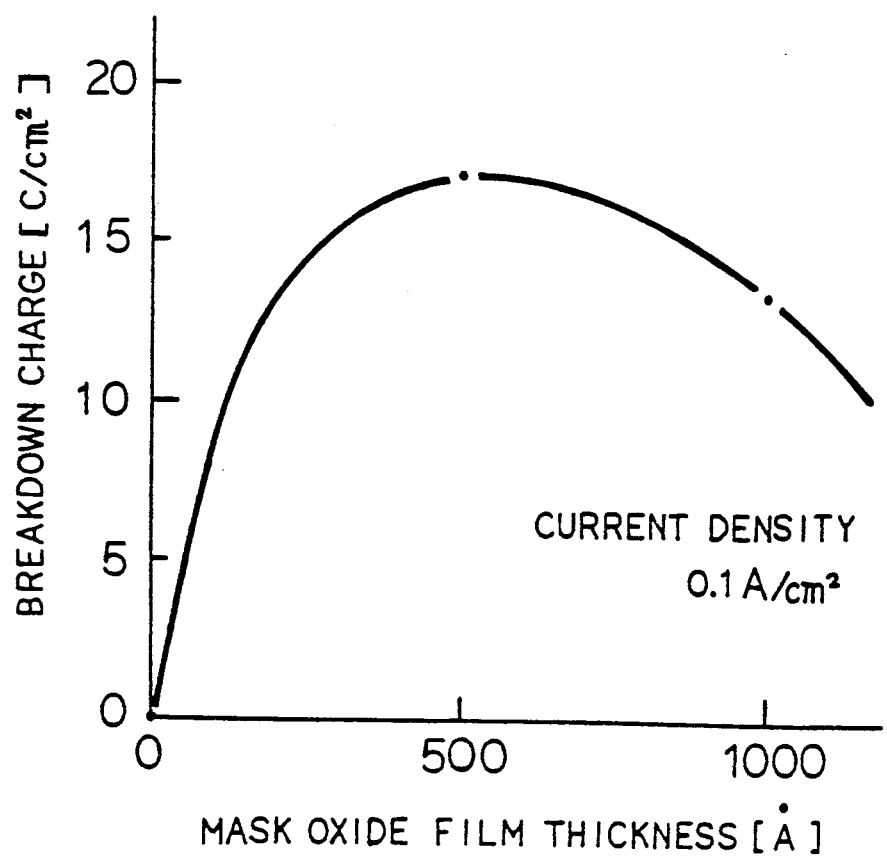
FIG. 3

METHOD OF MAKING SEMICONDUCTOR DEVICES HAVING AN IMPLANT DAMAGE PROTECTION FILM ON THE GATE ELECTRODE SIDEWALLS

BACKGROUND OF THE INVENTION

1. Field of the Invention

The present invention relates to a method of manufacturing semiconductor devices, such as miniature MOS transistors, EPROMs, EEPROMs and flash-type EEPROMs, that use a thin oxide film as a gate insulating film.

2. Description of the Related Art

FIG. 2 shows the structure in cross section of a memory cell of an ultraviolet erasable EPROM manufactured according to the prior art. This memory cell has a gate insulation film 102 in the form of a thin oxide film formed over the surface of a semiconductor substrate 101. A first layer polysilicon gate electrode 103, which will form a floating gate, is deposited on the gate insulation film 102 by a chemical vapor deposition (CVD) method. The polysilicon electrode 103 is subjected to thermal oxidation to form an inter-polysilicon-layer insulation film 104. Further, on this insulation film 104, a second layer polysilicon gate electrode 105, which will work as a control gate, is deposited by a CVD method. Then, the floating gate electrode 103, the inter-polysilicon-layer 104 and the control gate electrode 105 are simultaneously etched using photoresist as a mask. As the last step, with the polysilicon gate electrodes used as an implantation mask, arsenic is implanted into the substrate to form a self-aligned source region 106 and a self-aligned drain region 107.

The above-identified self-aligning ion implantation, which is performed during the process of forming the source and drain regions in MOS transistors and memory cells that use a thin oxide film as a gate insulation film, causes damage to the structure of the thin oxide film directly below the polysilicon gate electrode edge. That is, flaws are introduced into the structure of the thin oxide film. In MOS transistors, a leakage current flows through this structural flaw between the gate electrode and the source and drain, rendering the transistors unable to function correctly.

In the case of memory cells, the ion implantation damage causes the following problem: when a positive high voltage is applied to the source or drain region, charges accumulated in the floating gate as information will flow out through the flaw as a leakage current, thus making nonvolatile storage of information impossible.

SUMMARY OF THE INVENTION

To solve the above problem, according to the invention, an ion implantation-induced damage protection film is formed on the polysilicon gate electrode side walls.

The present method is applied to a semiconductor device in which a polysilicon gate electrode is provided on a gate insulation film on the surface of a semiconductor substrate and in which impurities are implanted into the surface of the semiconductor substrate by an ion implantation method to form source and drain regions in the substrate.

In the present method, an ion implantation-induced damage protection film is provided on side walls of the polysilicon gate electrode, so that a flaw induced by ion implantation damage in the gate insulation film can be minimized under the polysilicon gate electrode edge.

BRIEF DESCRIPTION OF THE DRAWING

FIG. 2 is a cross-sectional view of the structure of an ultraviolet erasable EPROM memory cell manufactured by a conventional semiconductor device manufacturing method.

FIG. 3 is a graph showing the relationship between the thickness of the mask oxide film formed on the side walls of the polysilicon gate electrode of a MOS capacitor, which has a gate insulation film made of an oxide film which is about 10 nm thick, and the amount of injected charges that cause eternal insulation breakdown.

DESCRIPTION OF THE PREFERRED EMBODIMENTS

One embodiment of this invention will be described in detail with reference to the accompanying drawings. FIG. 1 is schematic sequential representation of the steps used to form a flash-type EEPROM structure according to a preferred embodiment of this invention.

Figure 1A:
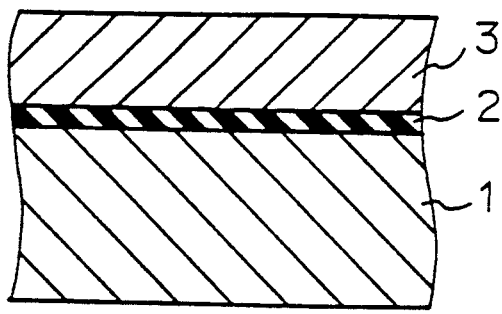
FIGS. 1A to 1D are schematic cross-sectional views illustrating successive steps of a method according to a preferred embodiment of the invention to form a flash-type EEPROM structure.

First of all, as shown in FIG. 1A, the surface of a semiconductor substrate 1 made of P-type silicon is thermally oxidized to form a gate insulating film 2 in the form of a thin silicon oxide film whose thickness is 10 nm.

Then, deposited over gate insulating film 2 by a chemical vapor deposition method is a first polysilicon gate electrode layer 3 which constitutes a floating gate, and phosphorus impurity is then diffused into layer 3.

Figure 1C:
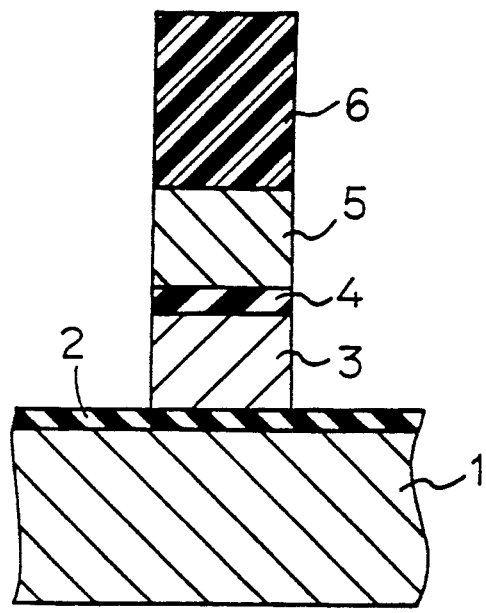
Figure 1B:
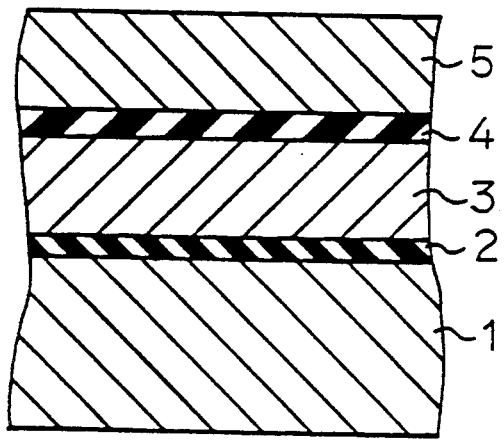
Figure 1D:
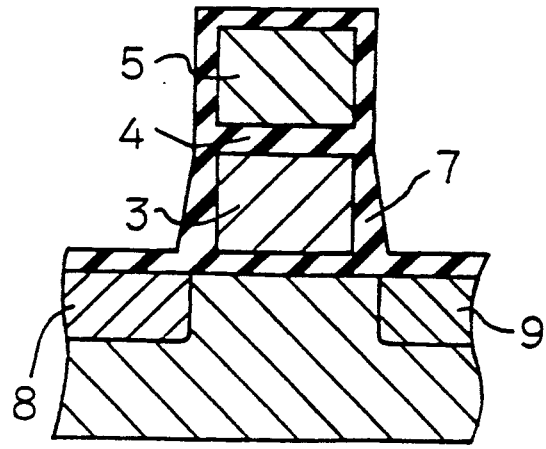

Further, as shown in FIG. 1B, the first layer polysilicon film 3 is thermally oxidized to form a polysilicon oxide film, that is, interpolysilicon-layer insulating film 4. A second layer polysilicon film which is used for a control gate electrode 5, is then deposited on the inter-polysilicon-layer insulating film 4.

Referring to FIG. 1C, after a photoresist pattern layer 6 is formed on second layer polysilicon film 5, the floating gate electrode 3, the inter-polysilicon-layer insulating film 4 and the control gate electrode 5 are simultaneously etched using the photoresist layer 6 as a mask.

After the removal of photoresist layer 6, the sidewall of the floating gate electrode is thermally oxidized in dry oxygen atmosphere at 900° C. to form an ion implantation-induced damage protection film 7 (a mask oxide film). If a bird's beak in the polysilicon gate resulting from the thermal oxidation poses a problem, the oxide film may be deposited over the entire surface of the wafer by a normal pressure chemical vapor deposition method and then subjected to an isotropic etching to form an ion implantation-induced damage protection film similar to the one described above, as shown in FIG. 1D.

As the final step, the polysilicon gate electrode 3–5 with the ion implantation-induced damage protection film 7 formed on its side walls is used as a mask for ion implantation of arsenic in which arsenic is implanted in a self-aligning manner to form a source region 8 and a drain region 9 in substrate 1.

FIG. 3 shows the relationship between the thickness of the mask oxide film, corresponding to film 7 of FIG.

1D, formed on the side walls of the polysilicon gate electrode of a MOS capacitor, which has a gate insulating film, corresponding to film 2 of FIG. 1, in the form of an oxide film about 10 nm thick, and the amount of injected charge that causes eternal insulation breakdown. The amount of injected charge, or current density, is set at a constant value of 0.1 A/cm 2. As can be seen from FIG. 3, when there is no mask oxide film 7 at all, insulation breakdown occurs the instant a voltage that cause a current conduction of 0.1 A/cm 2 is applied. As the thickness of the mask oxide film increases, however, the amount of injected charge that causes the breakdown also increases. The insulation strength is maximum at a thickness of around 500 Å, beyond which it decreases gradually.

The ion implantation, performed in a self-aligning manner to form source and drain regions in MOS transistors and memory cells that employ a thin oxidized film as the gate insulation film, causes damage to the structure of the thin gate insulating film under the polysilicon gate electrode edge, introducing flaws therein. The ion implantation-induced damage protection film, corresponding to film 7 of FIG. 1D, formed on the side walls of the polysilicon gate electrode according to this invention shifts the damaged area slightly away from directly under the polysilicon gate electrode edge toward the source and drain regions. This makes the MOS transistors and memory cells more resistant to the adverse effects of ion implantation-induced structural flaws when a high electric field is applied to the silicon substrate or the gate electrode. As a result, a leakage current that flows through the ion implantation-induced flaws in the MOS transistors and memory cells is reduced.

This application relates to subject matter disclosed in Japanese application No. 2-19651, filed on Jan. 30, 1990, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. In a method of manufacturing a semiconductor device, which method includes forming a gate insulating film having a thickness of about 10 nm over the surface of a semiconductor substrate, forming a polysilicon gate electrode on the gate insulating film, the gate electrode having an edge and side walls, and implanting impurities into the semiconductor substrate near its surface by an ion implantation method to form source and drain regions in the substrate, the improvement wherein said method comprises the step of providing an ion implantation-induced damage protection film having a thickness of the order of 500 Å on the side walls of the polysilicon gate electrode to minimize flaws induced by ion implantation damage in the gate insulation film directly under the polysilicon gate electrode edge.

2. A method as defined in claim 1 wherein the gate electrode includes a first polysilicon gate layer disposed on the gate insulating film, an inter-polysilicon-layer insulating film disposed on the first gate layer and a second polysilicon gate layer disposed on the first polysilicon gate layer, each gate layer and the gate insulating film extend to the side walls of the gate electrode, and the ion implantation-induced damage protection film covers each gate layer and the gate insulating film at the side walls of the gate electrode.

* * * * *